United States Patent [19]

Bletz et al.

[11] Patent Number: 4,647,175
[45] Date of Patent: Mar. 3, 1987

[54] CIRCUIT ARRANGEMENT FOR AN ELECTRONIC EXPOSURE METER

[75] Inventors: Walter Bletz, Braunfels; Rolf Magel, Fernwald, both of Fed. Rep. of Germany

[73] Assignee: Ernst Leitz Wetzlar GmbH, Wetzlar, Fed. Rep. of Germany

[21] Appl. No.: 757,882

[22] Filed: Jul. 23, 1985

[30] Foreign Application Priority Data

Jul. 23, 1984 [DE] Fed. Rep. of Germany ....... 3427055

[51] Int. Cl.⁴ .......................... G03B 7/02; G03B 7/26; G03B 17/18
[52] U.S. Cl. .................................. 354/473; 354/484; 354/486; 354/289.1
[58] Field of Search ................ 354/484, 486, 165–175, 354/289.1, 289.12

[56] References Cited

U.S. PATENT DOCUMENTS

| | | | |
|---|---|---|---|
| 3,608,448 | 9/1971 | Imai | 354/486 X |
| 4,387,977 | 6/1983 | Uchidoi et al. | 354/484 |
| 4,540,266 | 9/1985 | Okubo | 354/484 X |

FOREIGN PATENT DOCUMENTS 2348250  4/1974  Fed. Rep. of Germany .

Primary Examiner—William B. Perkey
Attorney, Agent, or Firm—Schwartz, Jeffery, Schwaab, Mack, Blumenthal & Evans

[57] ABSTRACT

In a switching circuit for an electronic exposure meter in optical devices with a photoelectric converter at the input of an amplifier which logarithmizes the output current from said converter, with a temperature compensation circuit and a photoelectric current limit value circuit and with an indicator, a voltage supply source having a main switch, means are provided on the device for coupling to the main switch. These means effect automatic connection or disconnection of the switching circuit to or from the supply source.

2 Claims, 3 Drawing Figures

CIRCUIT ARRANGEMENT FOR AN ELECTRONIC EXPOSURE METER

BACKGROUND OF THE INVENTION

The present invention pertains to a circuit arrangement for an electronic exposure meter in optical devices having a photoelectric converter at the input of an amplifier which logarithmizes the outpt of said converter, having a temperature compensation circuit and a photoelectric current limit value circuit arrangement, and also having a voltage supply source and a main switch.

Circuit arrangements of this type are known for photographic cameras, for example, from German Pat. No. 25 58 155 or German Offenlegungsschrift No. 28 22 035. In order to supply them with an operating voltage, they are connected to a matching supply source by a switch when the camera is operated.

It is a disadvantage of such arrangements that only this process takes place automatically. The circuit arrangement is disconnected from the operating voltage by a separate operation. The rapid consumption of energy if this step is omitted can lead to significant camera malfunctions.

SUMMARY OF THE INVENTION

It is therefore an object of the invention to provide an improved switching circuit arrangement for an electronic exposure meter. A particular object of the present invention is to provide a practical combination of devices for automatic disconnection of the circuit arrangement from the voltage supply source, in order to prevent an unnecessary consumption of energy and to ensure correct functioning of the camera.

A further object of the invention is to provide an improved camera embodying the switching circuitry according to the invention.

These objects are met in the present invention by providing an optical device comprising a voltage supply source, an electronic exposure meter circuit, main switch means electrically interposed between said voltage supply source and the circuit for alternate connection and disconnection of the circuit and the voltage supply source, and means for coupling the main switch means to a mechanism provided on the optical device to permit the mechanism to effect automatic operation of the main switch means.

BRIEF DESCRIPTION OF THE DRAWINGS

An exemplary embodiment of the invention is illustrated in the drawings and is described in greater detail below.

In the drawings.

DETAILED DESCRIPTION OF THE PREFERRED EMBODIMENTS

According to the present invention a circuit arrangement of the type described in the introduction is modified by providing means on the device for coupling to the mains switch. These means effect an automatic connection or disconnection of the circuit arrangement to or from the voltage supply source. In this arrangement, the main switch is a mechanical switching element functioning in addition to an electronic off switch, which also safely prevents a slow discharge of the battery.

Figure 1:
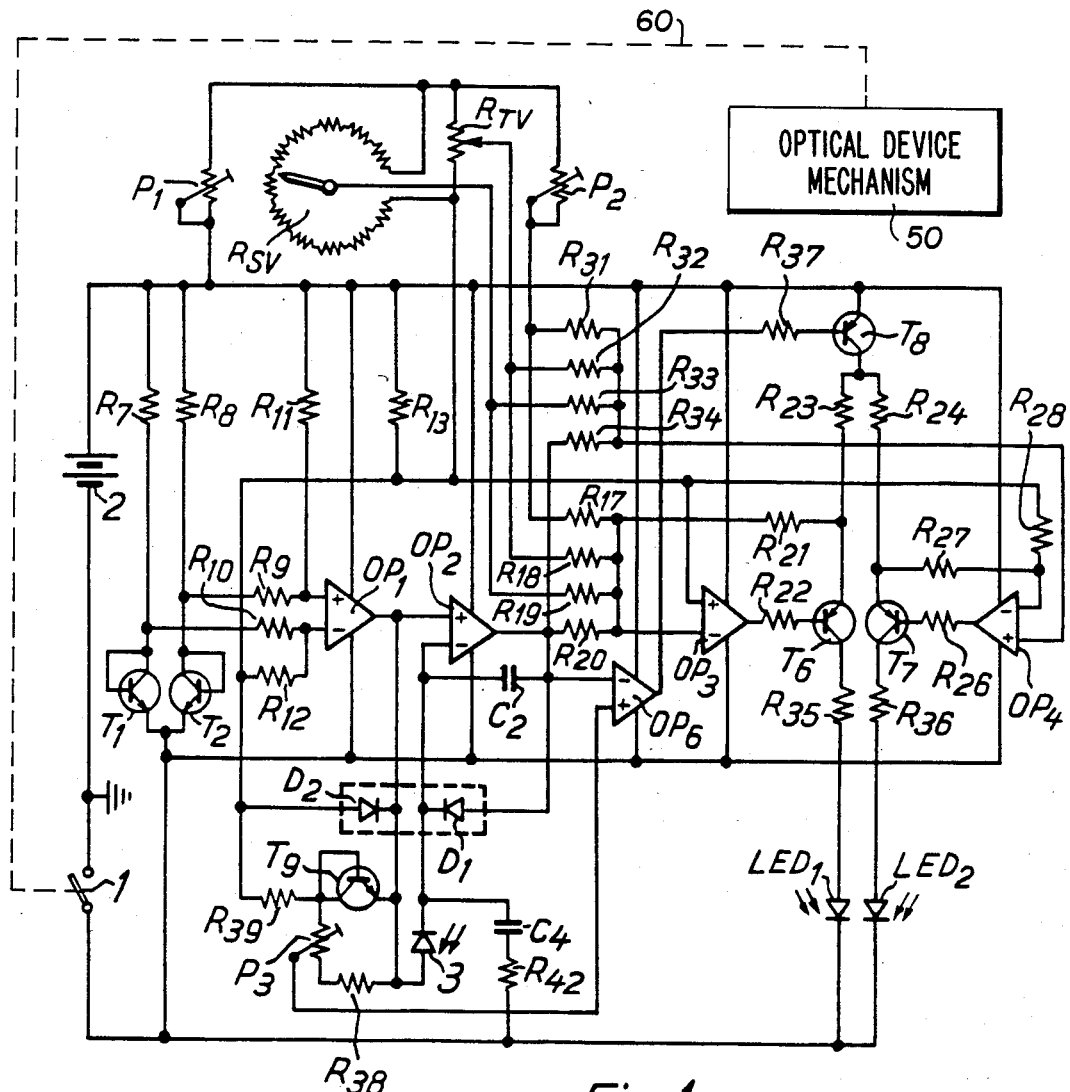
FIG. 1 is a circuit diagram of the arrangement according to the invention.

In the exemplary embodiment of the circuit arrangement shown in FIG. 1, an operational amplifier $OP_2$ functions as a current/voltage converter and a non-linear component $D_2$ serves for temperature compensation while measuring illumination with an electronic exposure meter, in which case a current derived from the brightness of the scene is converted into a logarithmic voltage (logarithmizer). In this arrangement, a switch 1 switches on a current source 2. Transistors $T_1$ and $T_2$, wired as diodes, are thus connected to the supply voltage, from which they are supplied with different currents through resistors $R_7$ and $R_8$. The differential voltage resulting from these currents is amplified in an operational amplifier $OP_1$ which is feedback-coupled through resistor $R_{12}$. The output of the operational amplifier $OP_1$ is connected to one pole of a temperature compensation stage $D_2$, while another pole is connected to the feedback resistor $R_{12}$ and to variable resistors $P_1$, $P_2$, $R_{SV}$, and $R_{TV}$.

At least one calculation stage $OP_3$, with feedback resistor $R_{21}$, which lies between the emitter of a transistor $T_6$ and referencr resistor $R_{23}$, follows the non-linear component $D_1$ and the pickups of variable resistors $P_1$, $P_2$, $R_{SV}$, and $R_{TV}$ via resistors $R_{17}$ through $R_{20}$. A follower stage $OP_4$ with resistors $R_{31}$ through $R_{34}$ is furthermore provided; it is preceded by resistors $R_{27}$ and $R_{28}$, which determine amplification, and a reference resistor $R_{24}$.

When using high-speed films, a still realizable exposure time can sometimes result, in the case of very low scene brightness. That is, currents which lie in the pA (picoamp) region and which can in practice no longer be processed with certainty are produced in a photoelectric diode 3. Errors in measuring the brightness of a scene, and resulting incorrectly exposed photographs thus occur.

To avoid, this, the inverting input of a comparator $OP_6$ is connected to the output of operational amplifier $OP_2$, which functions as a current/voltage converter. With the aid of this comparator, light-emitting diodes $LED_1$ or $LED_2$ at the outputs of calculation stage $OP_3$ and follower stage $OP_4$ are turned off when the light intensity of the object being measured falls below a certain limit value.

A circuit network consisting of resistor $R_{39}$, transistor $T_9$, wired as a diode, and potentiometer $P_3$ is at the non-inverting input of comparator $OP_6$.

The output of comparator $OP_6$ is connected to the base of a transistor $T_8$ through resistor $R_{37}$. If comparator $OP_6$ responds, its output becomes a positive potential. As a result of this, transistor $T_8$ becomes non-conductive. Therefore, no current flows to light-emitting diodes $LED_1$ and $LED_2$.

The circuit network consisting of resistor $R_{39}$, transistor $T_9$, potentiometer $P_3$, and resistor $R_{38}$ accordingly has the object of providing a criterion for switching off the exposure meter indicator, in the present case light-emitting diodes $LED_1$ and $LED_2$, whenever the light intensity exceeds or falls short of limit values, which are freely selected in advance at room temperatures via potentiometer $P_3$ on the exposure meter.

It is clear from known diode characteristics at various temperatures that higher inverse currents flow at higher temperatures. In the case of the present circuit arrangement, therefore, higher error currents flow to the inputs of the operational amplifiers. This also applies to the inverse currents generated by photoelectric diode 3. The operational amplifier $OP_2$ thus also receives a higher error current than at room temperature (20° C.). By means of to the circuit network described above, at a temperature of e.g., +60° C., the set light intensity limit at which the indicator should be turned off is reached two stops sooner.

The circuit arrangement in FIG. 1 further has a buffer, located between the negative pole of the supply source 2 and the inverting input of the operational amplifier $OP_2$ and consisting of resistor 42 and capacitor $C_4$. Its task is to ensure a flow of current to the indicator, consisting of light-emitting diodes $LED_1$ and $LED_2$, when the exposure meter is connected to the supply voltage.

Connecting the supply voltage allows a transient process to begin in operational amplifier $OP_2$, during which its output will then accept a "positive" supply for a short time. If this is the case, the capacitance of photoelectric diode 3 is reversed via the non-linear component $D_1$ in such a way that there is a positive charge at the inverting input of operational amplifier $OP_2$. This charge does not decay spontaneously, since the inverting input of operational amplifier $OP_2$, the photoelectric diode 3, and the non-linear component $D_1$ are very "highly resistive" in the reverse direction.

There is then a very low potential at the output of the operational amplifier $OP_2$, as a result of which comparator $OP_6$ turns off the indicator consisting of light-emitting diodes $LED_1$ and $LED_2$. However, since only a small photoelectric current is available in the lower light intensity region to reverse the photoelectric diode 3, the indicator remains off for the time being.

This temporary "failure" of the indicator is prevented by a buffer consisting of resistor $R_{42}$ and capacitor $C_4$. During the shor starting pulse, capacitor $C_4$ cannot become perceptibly charged, since resistor $R_{42}$ is "highly resistive". After the starting pulse, the cathode of photoelectric diode 3 is drawn via the buffer to the negative pole of the supply source 2, so that comparator $OP_6$ does not respond as a result. As the process continues, capacitor $C_4$ charges up to the voltage between the negative pole of supply source 2 and the potential of the working point at the non-inverting input of the operational amplifier $OP_2$, which functions as a current/voltage converter. Comparator $OP_6$ responds as a result, and transistor $T_8$ becomes conductive. The current resulting from the measurement can be measured, and current can flow through light-emitting diodes $LED_1$ and $LED_2$.

Resistor $R_{42}$ furthermore serves to stabilize the circuit.

When using the circuit arrangement defined by the invention in a photographic camera, connection and disconnection can be accomplished automatically by coupling the switch 1 with a mechanism of the optical device 50 such as the shutter winding or the second shutter curtain in the case of a camera. This coupling is effected by conventional coupling means 60 indicated by a broken line in FIG. 1. This yields an advantage in that the supply source 2 is turned off after the shutter process, and that undesirable discharge is no longer possible, even if the otherwise conventional semiconductor switches still allow certain leakage currents to flow after switching off.

It is also conceivable, however, that the novel circuit arrangement be disconnected from the supply source 2 by the shutter speed setting knob, for example, by setting it to "B".

It is particularly advantageous that both the second shutter curtain and the shutter speed setting knob affect the camera's main switch.

Figure 2:
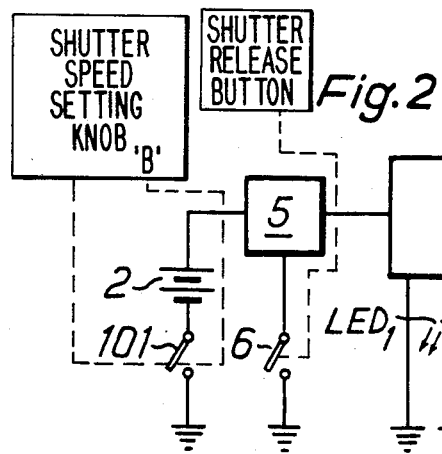
FIG. 2 is a diagram of an exemplary application for the circuit arrangement according to the invention.

Further provision can be made, however, to have the circuit arrangement automatically disconnect itself from the supply source 2 by releasing a button combined with the shutter release button. An exemplary embodiment of this is shown schematically in FIG. 2, in which the novel circuit arrangement is labeled 4, a cutoff devicr is labeled 5, and a final switch on the supply source 2 is labeled 6.

If a switch 101 is closed when the shutter is cocked, the circuit arrangement will be connected to the supply source 2 only at the time when switch 6 is closed, e.g., by pressing the shutter release button, not shown here. Current then flows from the supply source 2 through the cutoff device 5 to the circuit arrangement 4. The cutoff device 5 includes a time delay component, which breaks the connection between the circuit arrangement 4 and the supply source 2 only when, say, 10 seconds have passed after the contact 6 is opened.

The supplementary circuit, which makes an indicator reading possible immediately after the connection is restored once the shutter is cocked, is advantageous, particularly in the case where the device is always turned off after the picture is taken, considering the problems outlined previously.

To bring the operational amplifier $OP_2$ to its working point as quickly as possible, it can be advantageous to use, in addition, the buffer consisting of resistor $R_{42}$ and capacitor $C_4$ described under FIG. 1. In this case, capacitor $C_4$ can be of lower capacitance than that required in the circuit as described in FIG. 1.

It is also conceivable to use only capacitor $C_4$ as a supplement to build up the correct potential at the input to the operational amplifier $OP_2$ more quickly, since with the smaller capacitance, no flutter will occur in the operational amplifier $OP_2$.

Operational aplifier $OP_2$ will also reach its working point very quickly when a light source is additionally disposed in the vicinity of photoelectric diode 3, which light source emits a short pulse of brightness when the exposure meter is turned on.

Figure 3:
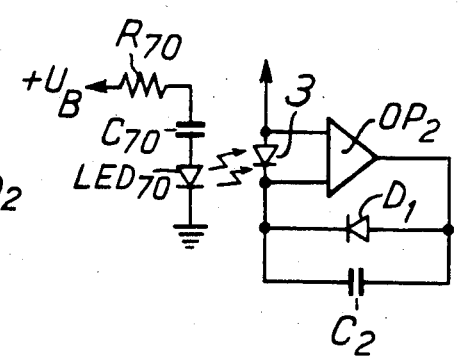
FIG. 3 is a diagram of an arrangement having a starter element.

An example of such a circuit is shown in FIG. 3. As in FIGS. 1 and 2, the light-measuring element is photoelectric diode 3. It is located at the inputs to the operational amplifier $OP_2$, whose feedback branch contains the logarithmizing diode $D_1$ and capacitor $C_2$.

A light-emitting diode $LED_{70}$, connected to the supply voltage through a resistor $R_{70}$ and a capacitor $C_{70}$, is disposed in the vicinity of photoelectric diode 3. The duration and intensity of the flash of light emitted by the light-emitting diode $LED_{70}$ is determined by the resistor $R_{70}$ and capacitor $C_{70}$.

What is claimed is:

1. Apparatus in a camera having a shutter mechanism, a release button and a shutter speed setting knob comprising:
   (a) a voltage supply source;
   (b) an electronic exposure meter circuit;
   (c) main switch means electronically interposed between said voltage supply source and said exposure meter circuit for alternate connection and disconnection of said exposure meter circuit and said voltge supply source;

(d) an auxiliary switch arranged when closed to permit current to flow between said voltage supply source and said exposure meter circuit, said auxiliary switch closed in response to actuation of said release button;

(e) delay means additionally connected between said voltage supply source and said exposure meter circuit and connected to said auxiliary switch for disconnecting said voltage supply source and said circuit a predetermined interval after said auxiliary switch has been opened;

(f) switch main switch means connected to said shutter mechanism for connecting and disconnecting said exposure meter circuit to said voltage supply source in response to operation of said shutter mechanism; and (g) said main switch means coupled to said shutter speed knob for disconnecting said voltage supply source from said exposure meter circuit when said shutter speed knob is in a "B" position thereof.

2. An optical device as claimed in claim 1 wherein said circuit comprises an indicator and a buffer means for ensuring a flow of current to said indicator immediately after said circuit is connected to said voltage supply source.

* * * * *

UNITED STATES PATENT AND TRADEMARK OFFICE
CERTIFICATE OF CORRECTION

PATENT NO. : 4,647,175
DATED : March 3, 1987
INVENTOR(S) : Walter BLETZ and Rolf MAGEL It is certified that error appears in the above—identified patent and that said Letters Patent is hereby corrected as shown below:

Column 2, line 27, "referencr" should read -- reference --.

Column 3, line 39, "shor" should read -- short --.

Column 4, line 14, "devicr" should read -- device --.

Column 5, line 2, "voltge" should read -- voltage --.

Column 6, line 1, "switch main switch" should read -- said main switch --.

Signed and Sealed this

Eighteenth Day of August, 1987

Attest:

DONALD J. QUIGG

Attesting Officer

Commissioner of Patents and Trademarks